United States Patent [19]

Hofmeister et al.

[11] 4,153,164
[45] May 8, 1979

[54] CARRIER FOR SEMICONDUCTIVE WAFERS

[75] Inventors: Lucien Hofmeister, Mountain View; Harvey L. Schulte, Los Altos, both of Calif.

[73] Assignee: Kasper Instruments, Inc., Sunnyvale, Calif.

[21] Appl. No.: 915,277

[22] Filed: Jun. 13, 1978

[51] Int. Cl.² .................. B23P 17/00; A47G 19/02
[52] U.S. Cl. .................................... 211/41; 118/500; 206/454; 294/87 R; 432/258
[58] Field of Search ............... 211/41, 40, 4; 269/296, 269/321 WE; 294/87 R; 206/454, 455; 118/500; 432/258, 259

[56] References Cited

U.S. PATENT DOCUMENTS

| | | | |
|---|---|---|---|
| 3,877,134 | 4/1975 | Shanahan | 211/41 X |
| 3,926,305 | 12/1975 | Wallistad | 206/454 X |
| 4,053,294 | 10/1977 | Sullivan | 432/259 X |

Primary Examiner—Roy D. Frazier
Assistant Examiner—Robert W. Gibson, Jr.
Attorney, Agent, or Firm—Roland I. Griffin

[57] ABSTRACT

A carrier having a plurality of transport channels arranged in stacked parallel relationship for receiving semiconductive wafers is provided with a pair of oppositely facing recessed regions extending partially into the transport channels. In each of these recessed regions a separate spring-loaded stop member is pivotally mounted for automatic movement to a raised inoperative position, where it is pivoted out of the transport channels to permit passage of the semiconductive wafers therethrough, when the carrier is set down, and for automatic movement to a lowered operative position, where it is pivoted into the transport channels to block passage of the semiconductive wafers therethrough and thereby impede spillage of any semiconductive wafers contained in the carrier, when the carrier is picked up. Each stop member coacts with a separate cam housing to provide a self-locking mechanism that is automatically operable for preventing the semiconductive wafers from moving the stop members to the raised inoperative position when the carrier is picked up and that is automatically released when the carrier is set down.

6 Claims, 6 Drawing Figures

CARRIER FOR SEMICONDUCTIVE WAFERS

CROSS-REFERENCE TO RELATED APPLICATION

This patent application is related to U.S. patent application Ser. No. 848,921 filed on Nov. 7, 1977, by Harvey L. Schulte and is assigned to the same assignee as that patent application.

BACKGROUND OF THE INVENTION

This invention relates generally to carriers for semiconductive wafers and, more particularly, to such carriers having provision for impeding spillage of semiconductive wafers therefrom during manual handling of the carriers.

Carriers for holding twelve, twenty-four or more spaced semiconductive wafers each are employed in many types of semiconductive wafer processing systems to facilitate batch processing and to minimize damage of the wafers due to improper handling. Such carriers are employed, for example, as input magazines for sequentially supplying semiconductive wafers to automatic wafer handling and processing systems, or as output magazines for sequentially receiving processed semiconductive wafers from such systems, or as intermediate (throughput) devices for holding semiconductive wafers that may require sampling, testing, or some other special handling at some point during processing by such systems. In nearly all of these cases the carriers must, at some point, be manually transported to or from such systems with the attendant risk that in so doing the semiconductive wafers may slip from the carriers and thereby be damaged or broken. This risk is particularly great in the case of carriers of the type permitting unobstructed passage of semiconductive wafers therethrough. If such carriers are tilted slightly forward or backward while they are being manually transported, any semiconductive wafers contained therein will slide out. Although this risk is much less critical in the case of carriers of the type permitting passage of semiconductive wafers into or out of the carriers from only one end of the carrier, care must still be exercised while such a carrier is being manually transported to avoid tilting it downward in the direction of its open end.

Past efforts to eliminate the risk of spilling semiconductive wafers from carriers while they are being manually transported have resulted in elaborate switching mechanisms for locking the semiconductive wafers in place in the carriers during manual transport thereof. However, the person transporting a carrier with such a switching mechanism had to remember to actuate the switching mechanism before picking up the carrier or run the risk of spilling the semiconductive wafers contained therein, in which event the risk was, in fact, not reduced at all. Moreover, when placing the carrier in a wafer handling and processing system the person transporting the carrier also had to remember to deactuate (or release) the switching mechanism in order to release the semiconductive wafers to the handling and processing system. In addition to these drawbacks, such switching mechanisms are generally complex and add significantly to the cost of the carrier.

SUMMARY OF THE INVENTION

The principal object of this invention is to provide an improved carrier for semiconductive wafers that has a self-locking mechanism automatically operable for impeding spillage of the semiconductive wafers from the carrier when the carrier is picked up and automatically released when the carrier is set down.

Another object of this invention is to provide an improved carrier of the foregoing type that is simple in design and operation and that is not significantly more expensive than a standard carrier.

These objects are accomplished in accordance with the illustrated preferred embodiment of this invention by providing a carrier having a pair of fixedly-spaced, oppositely-facing, side plates forming a plurality of transport channels arranged in parallel stacked relationship for receiving a like plurality of semiconductive wafers and by further providing each side plate with a recessed region extending partially into the transport channels. A separate stop member mounted for both axial translational and pivotal movement in the recessed region of each side plate is constrained, by engagement with a corresponding cam housing mounted on the same side plate, to movement between a lowered operative position, where the stop member partially protrudes from the bottom of the carrier and is pivoted into the transport channels, and a raised inoperative position, where the stop member is retracted so as not to protrude from the bottom of the carrier and is pivoted out of the transport channels. The stop members are spring loaded for automatic movement to the lowered operative position when the carrier is picked up, thereby blocking passage of the semiconductive wafers through the transport channels and impeding spillage of the semiconductive wafers from the carrier as it is transported, and are slidably disposed for automatic movement to the raised inoperative position when the carrier is set down, thereby permitting free passage of the semiconductive wafers through the transport channels. Cam slots in the cam housing are disposed for engagement with corresponding cam followers of the stop members to provide a self-locking mechanism that is automatically operable for preventing the semiconductive wafers from forcing the stop members to the raised inoperative position when the carrier is picked up and that is automatically released when the carrier is set down.

DESCRIPTION OF THE PREFERRED EMBODIMENTS

Figure 1:
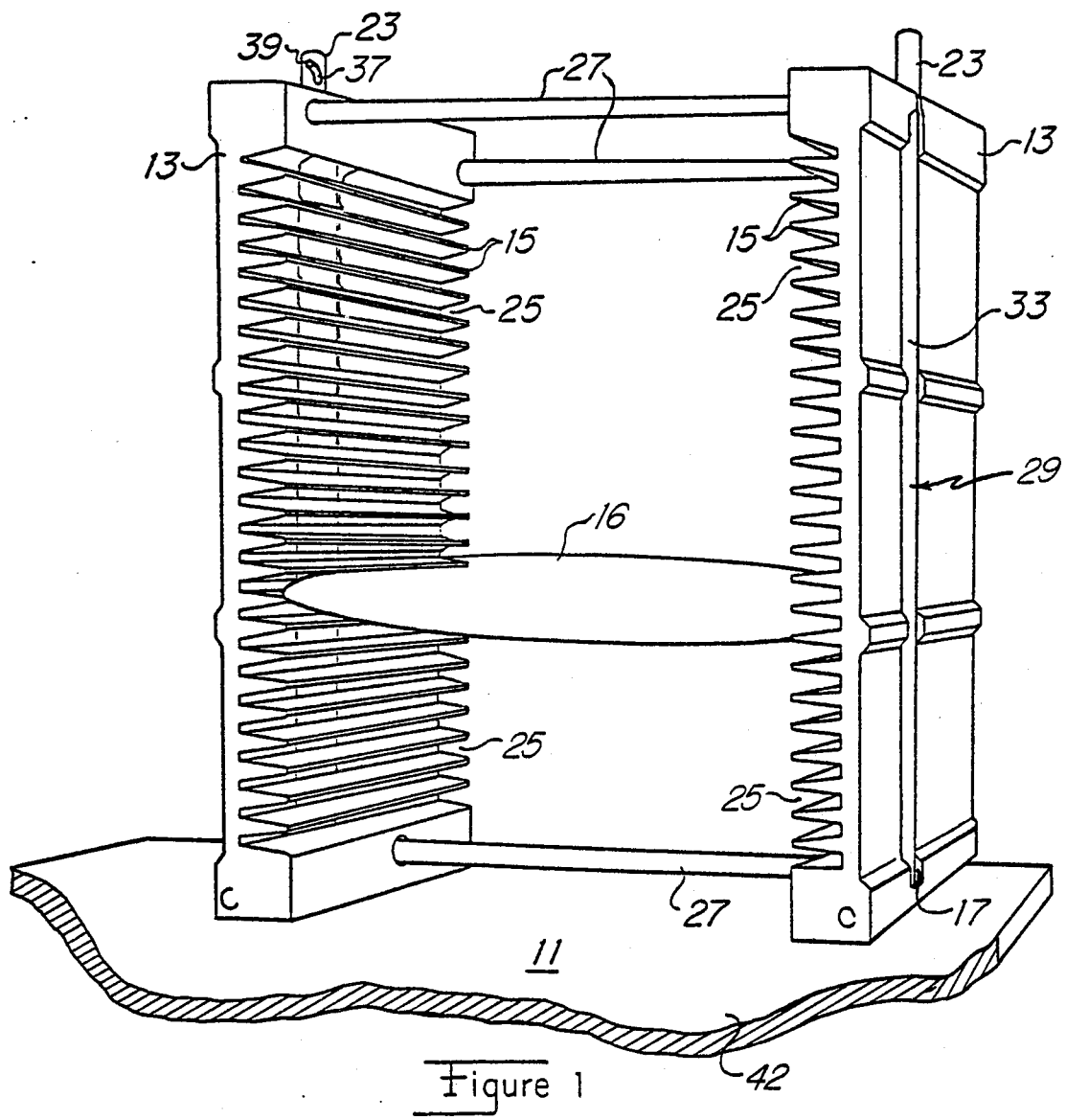
FIG. 1 is a perspective view of a carrier according to the preferred embodiment of the present invention when the carrier is set down upon the surface of a support member.
Figure 2:
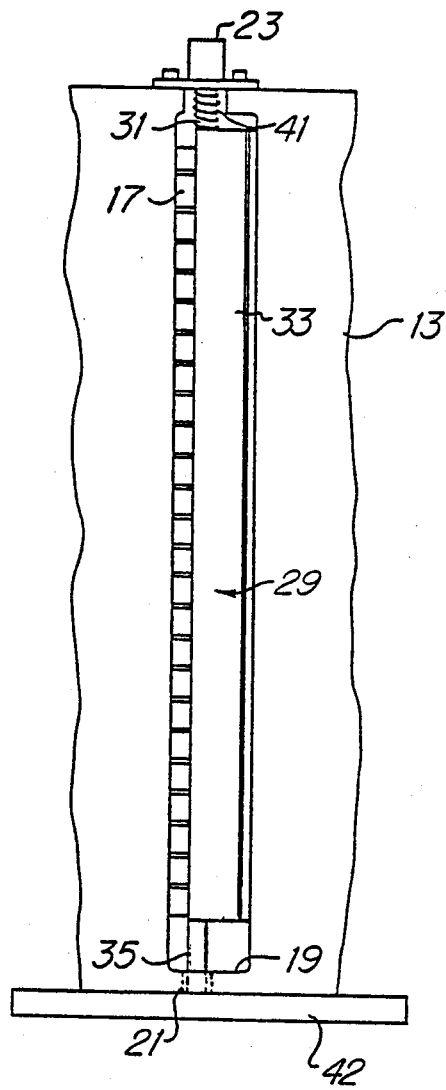
FIG. 2 is a side view of the carrier of FIG. 1 showing the orientation of a stop member thereof when the carrier is set down upon the surface of a support member.
Figure 3:
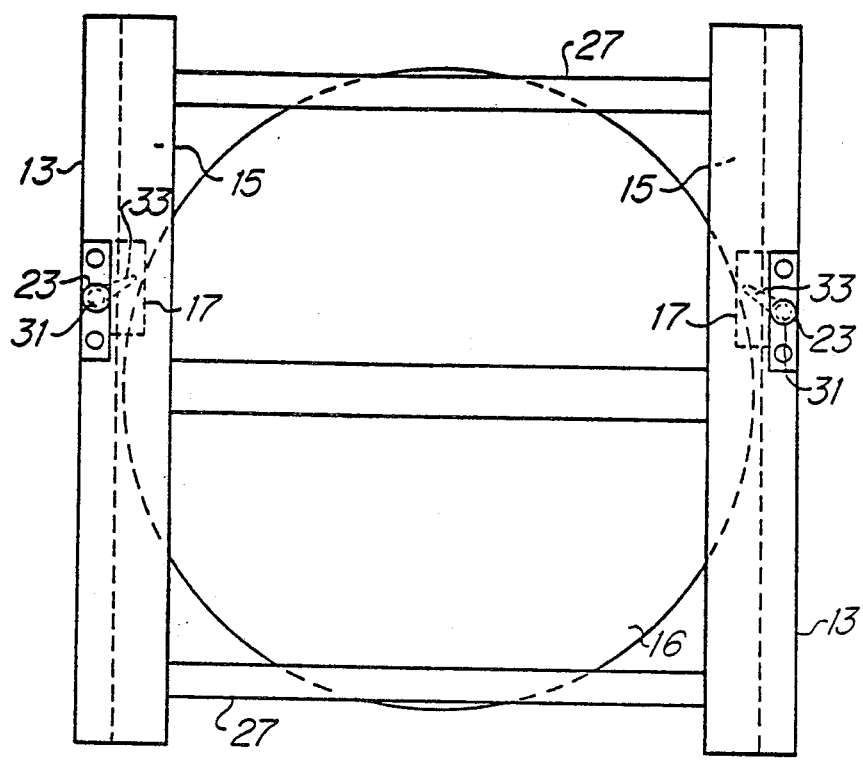
FIG. 3 is a top view of the carrier of FIG. 1 when the carrier is picked up.

Referring now to FIGS. 1-4, there is shown a carrier 11 with two side plates 13. Each side plate 13 has a plurality of flanges 15 and a recessed region 17 with a shaft-support portion 19 having an aperture 21 therethrough. A separate cam housing 23 is affixed (for example, by screws) to the top surface of each side plate 13 adjacent to the corresponding recessed region 17. Each recessed region 17 is therefore bounded at the top end by the corresponding cam housing 23 and at the bottom end by the corresponding shaft-support portion 19. The side plates 13 are spaced apart a selected distance, with the flanges 15 facing each other such that corresponding pairs of consecutive flanges on each side plate 13 form stacked, parallel transport channels 25 into which semiconductive wafers 16 or other such workpieces may be placed as shown in FIGS. 1 and 3. Rods 27, which are anchored, for example, by rivets or screws to the side plates 13, serve to fix the position and separation of the side plates 13 with respect to each other so as to provide sufficient clearance for passage of semiconductive wafers 16 through the transport channels 25. The recessed regions 17 extend partially into the flanges 15 and, hence, the transport channels 25 at a selected angle substantially perpendicular to the flanges and transport channels.

Figure 4:
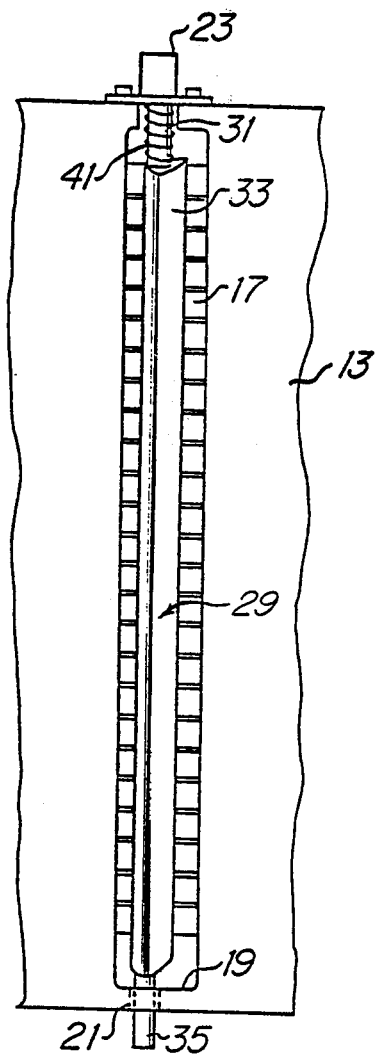
FIG. 4 is a side view of the carrier of FIG. 1 showing the orientation of a stop member thereof when the carrier is picked up.

A stop member 29 is mounted in each recessed region 17 for both pivotal and axial translational movement between a raised inoperative position as shown in FIG. 2 and a lowered operative position as shown in FIG. 4. Each stop member 29 comprises a top shaft portion 31, a middle or flag shaft portion 33, and a bottom shaft portion 35. The top shaft portion 31 of each stop member 29 is disposed for pivotal and axial translational movement within the corresponding cam housing 23, and the bottom shaft portion 35 of each stop member 29 is disposed for similar movement within aperture 21 of the shaft-support portion 19 of the corresponding side plate 13. Matching cam slots 37 are provided in oppositely facing portions of cam housings 23 for engagement with corresponding cam follower pins 39 provided adjacent to the upper ends of the top shaft portions 31 of the stop members 29. Each cam follower pin 39 is constrained for movement within and along the corresponding cam slot between the raised inoperative and lowered operative positions of the corresponding stop member 29. A separate compressible spring 41 coaxially disposed around the top shaft portion 31 of each stop member 29 between the flag shaft portion 33 and the base of the corresponding cam housing 23 spring loads the stop member 29 to the lowered operative position when the carrier is picked up.

Figure 5:
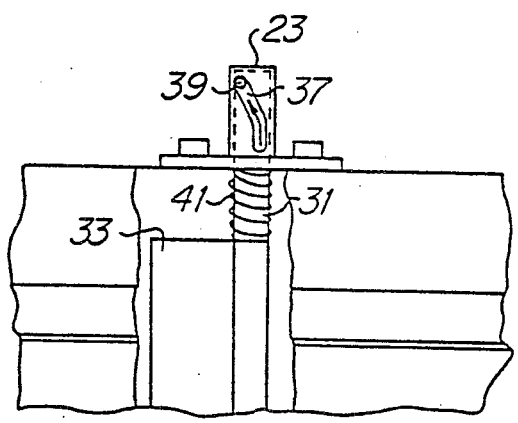
FIGS. 5 and 6 are cutaway side views of an upper portion of the carrier of FIG. 1 showing a cam housing and the position and orientation of a corresponding stop member when the carrier is set down upon the surface of a support member and when the carrier is picked up, respectively.
Figure 6:
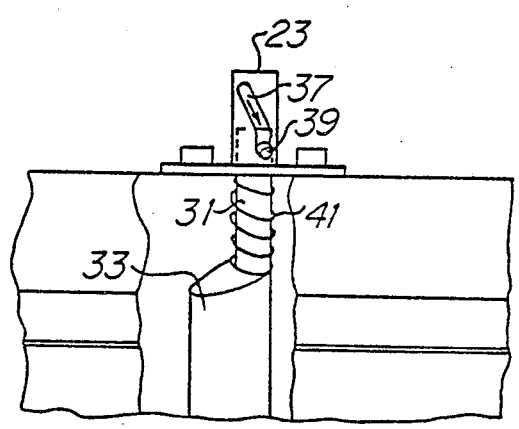

In the lowered operative position of each stop member 29, the flag shaft portion 35 partially protrudes into the transport channels 25 of the carrier 11 and the bottom shaft portion 35 partially protrudes from the bottom of the shaft-support portion 19 of the corresponding side plate 13 a vertical distance substantially equal to the vertical distance between the opposite ends of the cam slot 37 of the corresponding cam housing 23. When the carrier 11 is set down upon the surface of a generally flat support member 42 (such as a holder of an automatic wafer handling and processing system) as shown in FIGS. 1 and 2, the bottom shaft portion 35 of each stop member 29 is automatically forced upward until fully retracted into the aperture 21 of the corresponding shaft-support portion 19 thereby compressing the corresponding spring 41 and forcing the top shaft portion 31 of the stop member further into the corresponding cam housing 23 as best shown in FIG. 5. The cam slot 37 of each cam housing 23 has a vertically extending lower portion and an obliquely extending upper portion so that as the top shaft portion 31 of the corresponding stop member 29 moves axially upward into the cam housing, the associated cam follower pin 39 moves in an upward and outward direction thereby pivoting the flag shaft portion 33 of the stop member out of the transport channels 25. This releases any semiconductive wafers 16 that may be contained in the carrier 11 (i.e., permits free passage of semiconductive wafers 16 into, out of, or through the transport channels 25 of the carrier). When the carrier 11 is picked up from the surface of the support member 42 as shown in FIGS. 3, 4, and 6, each spring 41 is released from its compressed state thereby automatically moving the corresponding stop member 29 axially downward to the lowered operative position at which the bottom shaft portion 35 of the stop member protrudes from the bottom of the carrier as described above. As the top shaft portion 31 of the corresponding stop member 29 moves axially downward, the associated cam follower pin 39 moves in a downward and inward direction pivoting the flag shaft portion 33 of the stop member into the transport channels 25. This blocks the passage of semiconductive wafers 16 through the transport channels 25 and thereby impedes spillage of the semiconductive wafers from the carrier as it is being picked up and transported.

The vertically extending lower portions of the cam slots 37 are oriented parallel to the axes of the stop members 29, and the obliquely extending upper portions of the cam slots are upwardly inclined relative to those axes. Thus, when the carrier 11 is picked up or being transported, the engagement of the cam follower pins 39 with the vertically extending lower portions of the corresponding cam slots 37 prevents the stop members 29 from being moved (for example, due to the weight of the semiconductive wafers 16 bearing upon the stop members) to the raised inoperative position until the stop members are forced axially upward to bring the cam follower pins 39 into engagement with the obliquely extending upper portions of the cam slots 37 by setting the carrier down upon the surface of a support member 42. This provides the stop members 29 with a self-locking mechanism that is automatically operable for locking the stop members in the lowered operative position when the carrier 11 is picked up and that is automatically released when the carrier is set down upon the surface of a support member.

In the carrier 11 described hereinabove the stop members 29 are operable for preventing spillage of the semiconductive wafers 16 from one open (input/output) end of the carrier, but not from the other. Thus, it is necessary to exercise some care not to tilt the carrier 11 downward in the direction of the other open (input/output) end of the carrier while transporting the carrier. However, in an alternative embodiment of the present invention; one or two stop members 29 may be mounted as described hereinabove adjacent to each open (input/output) end of the carrier 11 to prevent the semiconductive wafers 16 contained in the carrier from spilling out of either open (input/output) end of the carrier when the carrier is being transported. In another alternative embodiment of the present invention the carrier 11 is provided with a back plate and one or more stop members 29 mounted as described hereinabove adjacent to the open (input/output) end of the carrier so that semiconductive wafers 16 may be safely retained within the carrier between the back plate and the stop members when the carrier is being transported.

We claim:

1. A carrier for preventing spillage of workpieces contained therein, said carrier comprising:
   a pair of side plates coupled together for forming a plurality of transport channels, at least one of said side plates having a recessed region extending partially into the transport channels;
   a stop member pivotally mounted in the recessed region for automatic movement between an inoperative position out of the transport channels to permit passage of the workpieces therealong when the carrier is set down and an operative position protruding into the transport channels to block passage of the workpieces therealong and prevent spillage of the workpieces from the carrier when it is picked up; and
   a self-locking mechanism operable for automatically preventing the stop member from moving to the operative position when the carrier is picked up and for automatically releasing the stop member when the carrier is set down.

2. A carrier as in claim 1 including a compressible spring for spring loading the stop member to the operative position when the carrier is picked up.

3. A carrier as in claim 1 wherein:
   each of said side plates has a plurality of oppositely facing flanges for forming the transport channels in parallel stacked relationship and a recessed region partially extending into the flanges from an upper portion to a lower portion of the side plate;
   a cam housing is affixed to the upper end of each side plate adjacent to the recessed region;
   a stop member is disposed in the recessed region of each side plate with one end mounted for axial translational and pivotal movement in the corresponding cam housing and with the other end mounted for similar movement in and partially extending from the lower portion of the side plate so as to automatically move the stop member to the inoperative position when the carrier is set down, thereby permitting passage of workpieces into and out of the transport channels; and
   a compressible spring is disposed so as to automatically move each stop member to the operative position when the carrier is picked up thereby blocking the transport channels and inhibiting spillage of workpieces contained therein.

4. A carrier as in claim 3 wherein:
   said workpieces are semiconductive wafers; and
   each stop member includes a top portion, a middle portion, and a bottom portion, the top portion being disposed for supporting the corresponding spring thereabout and being partially disposed within the corresponding cam housing for axial translational and pivotal movement therein, the middle portion being disposed for pivotal movement into and out of the transport channels, and the bottom portion being disposed for axial translational and pivotal movement in the lower portion of the corresponding side plate.

5. A carrier as in claim 3 wherein:
   each cam housing has a cam slot having a vertically extending lower portion and an obliquely extending upper portion; and
   each stop member has a cam follower portion for engagement with the cam slot of the corresponding cam housing to constrain the stop member to axial translational and pivotal movement between the operative and inoperative positions.

6. A carrier as in claim 5 wherein:
   the vertically extending lower portion of each cam slot is oriented parallel to the axes of the stop members, and the obliquely extending upper portion of each cam slot is upwardly inclined relative to those axes; and
   the cam follower portion of each stop member is engaged with the vertically extending lower portion of the corresponding cam housing when the stop member is in the operative position and with the obliquely extending upper portion of the corresponding cam housing when the stop member is in the inoperative position.

* * * * *

UNITED STATES PATENT AND TRADEMARK OFFICE
CERTIFICATE OF CORRECTION

PATENT NO. : 4,153,164
DATED : May 8, 1979
INVENTOR(S) : Lucien Hofmeister, Harvey L. Schulte It is certified that error appears in the above-identified patent and that said Letters Patent are hereby corrected as shown below:

Abstract, line 8, "itis" should read "it is";

Column 3, line 50 delete "35" and substitute "33";

Column 4, line 56 delete the semicolon and substitute a comma; and

Column 5, line 20 (claim 1, line 18) cancel "operative" and substitute "inoperative".

Signed and Sealed this

Fourth Day of December 1979

[SEAL]

Attest:

SIDNEY A. DIAMOND

*Attesting Officer*  *Commissioner of Patents and Trademarks*

UNITED STATES PATENT AND TRADEMARK OFFICE
CERTIFICATE OF CORRECTION

PATENT NO. : 4,153,164
DATED : May 8, 1979
INVENTOR(S) : Lucien Hofmeister, Harvey L. Schulte It is certified that error appears in the above-identified patent and that said Letters Patent are hereby corrected as shown below:

Abstract, line 8, "itis" should read "it is";

Column 3, line 50, delete "35" and substitute "33";

Column 4, line 56, delete the semicolon and substitute a comma;

Column 5, line 20 (claim 1, line 18), cancel "operative" and substitute "inoperative";

Column 6, line 38, immediately after "tion" insert "of the cam slot"; and

Column 6, line 40, immediately after "portion" insert "of the cam slot".

THIS CERTIFICATE SUPERSEDES CERTIFICATE OF CORRECTION ISSUED December 4, 1979.

Signed and Sealed this

Twenty-fifth Day of December 1979

[SEAL]

Attest:

SIDNEY A. DIAMOND

Attesting Officer   Commissioner of Patents and Trademarks